(12) United States Patent
Gupta et al.

(10) Patent No.: US 7,688,887 B2
(45) Date of Patent: Mar. 30, 2010

(54) PRECISION ADAPTIVE EQUALIZER

(75) Inventors: Atul K. Gupta, Mississauga (CA);
Wesley C. d'Haene, Burlington (CA)

(73) Assignee: Gennum Corporation (CA)

( * ) Notice: Subject to any disclaimer, the term of this patent is extended or adjusted under 35 U.S.C. 154(b) by 1562 days.

(21) Appl. No.: 10/930,933

(22) Filed: Aug. 31, 2004

(65) Prior Publication Data

US 2005/0047500 A1    Mar. 3, 2005

Related U.S. Application Data

(60) Provisional application No. 60/499,435, filed on Sep. 2, 2003.

(51) Int. Cl.
*H03H 7/30* (2006.01)
(52) U.S. Cl. .................................................. 375/232
(58) Field of Classification Search ................... 375/232
See application file for complete search history.

(56) References Cited

U.S. PATENT DOCUMENTS

| | | | | |
|---|---|---|---|---|
| 4,005,477 | A * | 1/1977 | Ottesen | 360/51 |
| 4,985,900 | A * | 1/1991 | Rhind et al. | 375/226 |
| 5,329,559 | A * | 7/1994 | Wong et al. | 375/373 |
| 5,450,033 | A * | 9/1995 | Hirabayashi | 329/315 |
| 5,903,605 | A | 5/1999 | Crittenden | |
| 5,991,339 | A * | 11/1999 | Bazes et al. | 375/232 |
| 6,002,538 | A * | 12/1999 | Kanegae et al. | 360/46 |
| 6,028,902 | A * | 2/2000 | Kiyanagi et al. | 375/355 |
| 6,522,702 | B1 * | 2/2003 | Maruyama | 375/324 |
| 6,590,945 | B1 * | 7/2003 | Brardjanian et al. | 375/340 |
| 6,822,484 | B1 * | 11/2004 | Boerstler | 327/3 |
| 6,940,926 | B1 * | 9/2005 | Yang et al. | 375/340 |
| 2002/0186633 | A1* | 12/2002 | Kai et al. | 369/47.51 |
| 2003/0103428 | A1* | 6/2003 | Lu et al. | 369/47.22 |
| 2004/0005001 | A1 | 1/2004 | Jones et al. | |

* cited by examiner

*Primary Examiner*—David C. Payne
*Assistant Examiner*—Leon-Viet Q Nguyen
(74) *Attorney, Agent, or Firm*—Jones Day

(57) ABSTRACT

In accordance with the teachings described herein, systems and methods are provided for a precision adaptive equalizer. A variable gain equalizer may be used to apply a variable gain to an input signal to generate an equalized output signal. A phase and pattern detector circuit may be coupled in a feedback loop with the variable gain equalizer. The phase and pattern detector circuit may be used to identify a high frequency data pattern in the equalized output signal and compare the high frequency data pattern with a clock signal to detect a high frequency phase error. The phase and pattern detector circuit may be further operable to generate an automatic gain control signal as a function of the high frequency phase error, the automatic gain control signal being fed back to the variable gain equalizer to control the variable gain applied to the input signal.

7 Claims, 6 Drawing Sheets

PRECISION ADAPTIVE EQUALIZER

CROSS-REFERENCE TO RELATED APPLICATION

This application claims priority from and is related to the following prior application: "Precision Adaptive Equalizer Method And System," U.S. Provisional Application No. 60/499,435, filed Sep. 2, 2003. This prior application, including the entirety of the written description and drawing figures, is hereby incorporated into the present application by reference.

FIELD

The technology described in this patent document relates generally to equalizers and equalization techniques. More specifically, this document describes a precision adaptive equalizer.

BACKGROUND

Standard equalization techniques for adapting a communication signal, such as a video signal, to the channel length are typically coarse in that the applied equalization is dependent upon the input swing or spectrum content. The equalization error that results from such techniques directly translates into jitter. As a rule of thumb, 1 dB of equalization error at a half data rate translates into 0.1UI (unit intervals) of jitter. Process variation adds to the equalization error.

SUMMARY

In accordance with the teachings described herein, systems and methods are provided for a precision adaptive equalizer. A variable gain equalizer may be used to apply a variable gain to an input signal to generate an equalized output signal. A phase and pattern detector circuit may be coupled in a feedback loop with the variable gain equalizer. The phase and pattern detector circuit may be used to identify a high frequency data pattern in the equalized output signal and compare the high frequency data pattern with a clock signal to detect a high frequency phase error. The phase and pattern detector circuit may be further operable to generate an automatic gain control signal as a function of the high frequency phase error, the automatic gain control signal being fed back to the variable gain equalizer to control the variable gain applied to the input signal.

DETAILED DESCRIPTION

Figure 1:
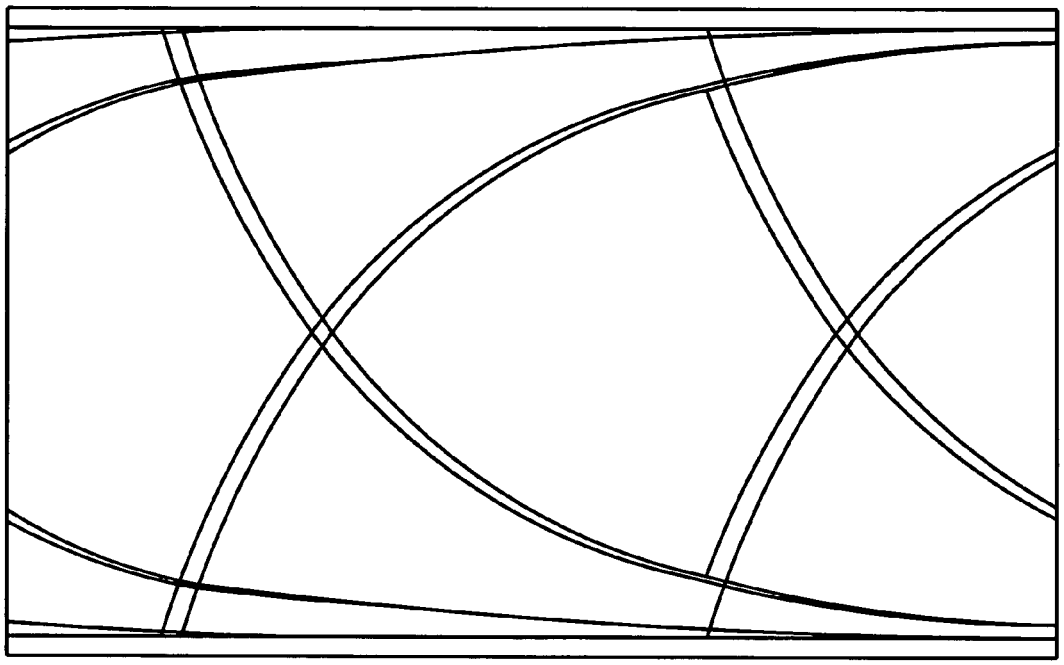
FIG. 1 is an eye pattern illustrating an example of an under-equalized signal.
Figure 2:
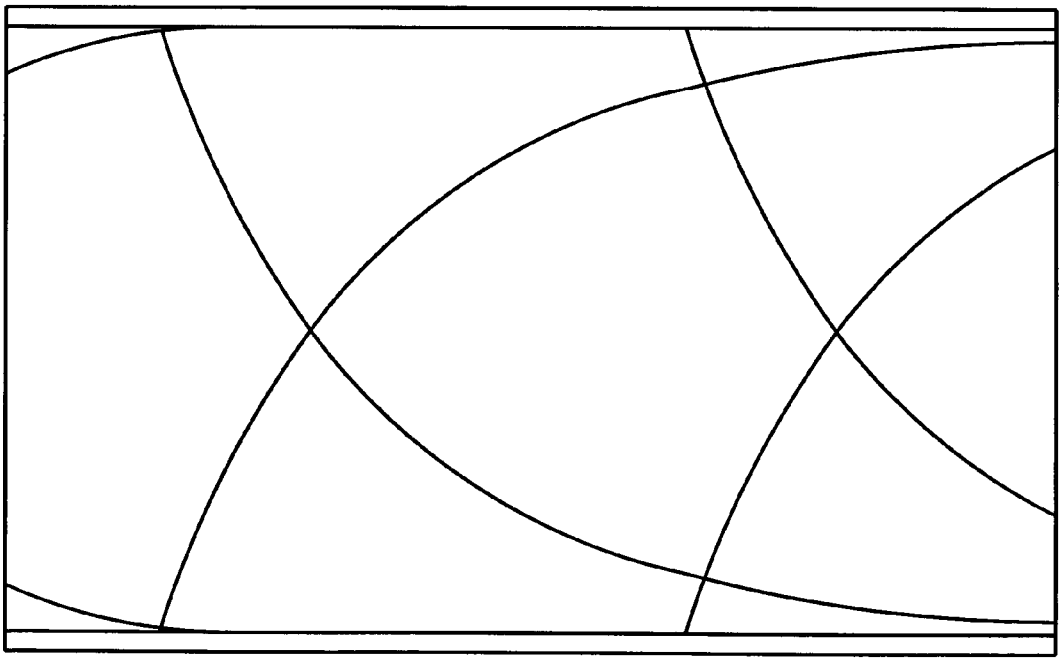
FIG. 2 is an eye pattern illustrating an example of a properly equalized signal.
Figure 3:
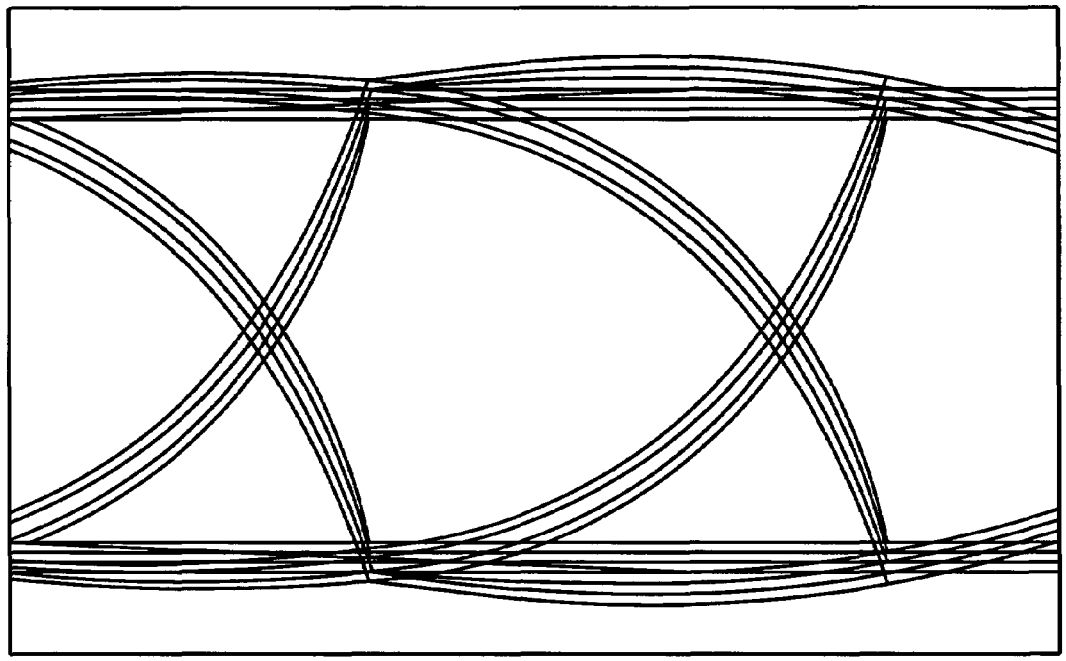
FIG. 3 is an eye pattern illustrating an example of an over-equalized signal.

A typical equalizer produces jitter in a predictable manner. Channel loss, which can be modeled as a low pass circuit, causes high frequency data edges to come early with respect to low frequency data edges. For example, channel loss will cause data edges generated by the high frequency data pattern "1010101010" to appear sooner than the data edges generated by the lower frequency data pattern "000111000111." An example of the phase difference between a high frequency data pattern and a low frequency data pattern caused by channel loss is illustrated in FIG. 1. Equalization causes the high frequency data edges to appear later (i.e., shifted to the right in the eye diagram of FIG. 1.) Ideally, equalization will cause the high frequency data edges and the low frequency data edges to converge, as illustrated in FIG. 2. However, if the data is over-equalized, then the high frequency data edges will appear late with respect to the low frequency data edges, as illustrated in FIG. 3. Therefore, both under-equalization (e.g., FIG. 1) and over-equalization (e.g., FIG. 3) produce a predictable error.

Figure 4:
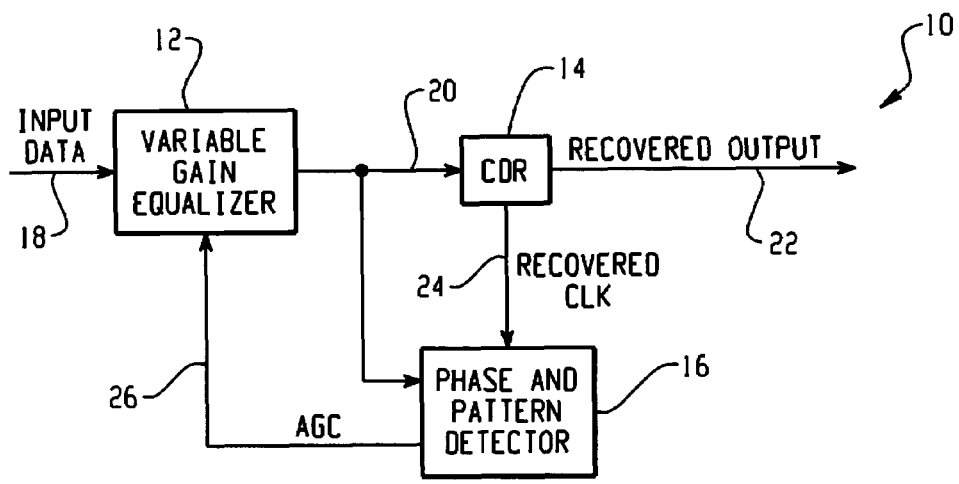
FIG. 4 is a block diagram of an example precision adaptive equalizer circuit.

FIG. 4 is a block diagram of an example precision adaptive equalizer circuit 10. The example circuit 10 includes a variable gain equalizer 12, a clock and data recovery (CDR) circuit 14 and a phase and pattern detector circuit 16.

The variable gain equalizer 12 applies a variable gain to an input signal 18 to generate an equalized output signal 20. The variable gain applied by the variable gain equalizer 12 is controlled by an automatic gain control (AGC) signal 26. The AGC signal 26 may, for example, be an analog or digital control signal that instructs the variable gain equalizer 12 to either increase or decrease the gain applied to the input signal 18.

The clock and data recovery (CDR) circuit 14 is operable to extract a recovered clock signal 24 from the equalized output signal 20. In addition, the CDR circuit 14 may generate a recovered output signal 22 by locking the equalized output signal 20 in phase with the recovered clock signal 24.

The phase and pattern detector circuit 16 is coupled in a feedback loop with the variable gain equalizer 12. The phase and pattern detector circuit 16 is operable to detect a predetermined high frequency data pattern (e.g., 101) in the equalized output signal 20 and compare the predetermined high frequency data pattern with the recovered clock signal 24 to detect a phase error. The phase and pattern detector circuit 16 generates the AGC signal 26 as a function of the phase error, which is fed back to the variable gain equalizer 12.

The CDR circuit 14 will lock the recovered clock signal 24 to the average of the phase positions of the low frequency data patterns (e.g., 001) and the high frequency data patterns (e.g., 101) present in the equalized output signal 20. Thus, if there is equalization error, then there will be a phase error between the high frequency data patterns and the recovered clock signal 24. The phase and pattern detector circuit 16 uses this phase error to adjust the variable gain of the variable gain equalizer 12 via the AGC signal 26 until the difference between the phase positions of the high frequency patterns (e.g., 101) and the recovered clock signal 24 (i.e., the average of the high and low frequency patterns) are zeroed. Once this phase error is zeroed, the phase positions of the high frequency patterns (e.g., 101) and the low frequency patterns (e.g., 001) will coincide, achieving an optimal equalization.

The operation of the precision adaptive equalizer circuit 10 may be expressed in mathematical terms. If the phase position of the low frequency pattern 001 is defined as x, and the phase position of the high frequency pattern is defined as y, then the expression y−(x+y)/2 will be zeroed by the equalizer feedback loop, as follows.

$$y-(x+y)/2=0;$$

$$2y-x-y=0; \text{ and}$$

$$x=y.$$

Figure 5:
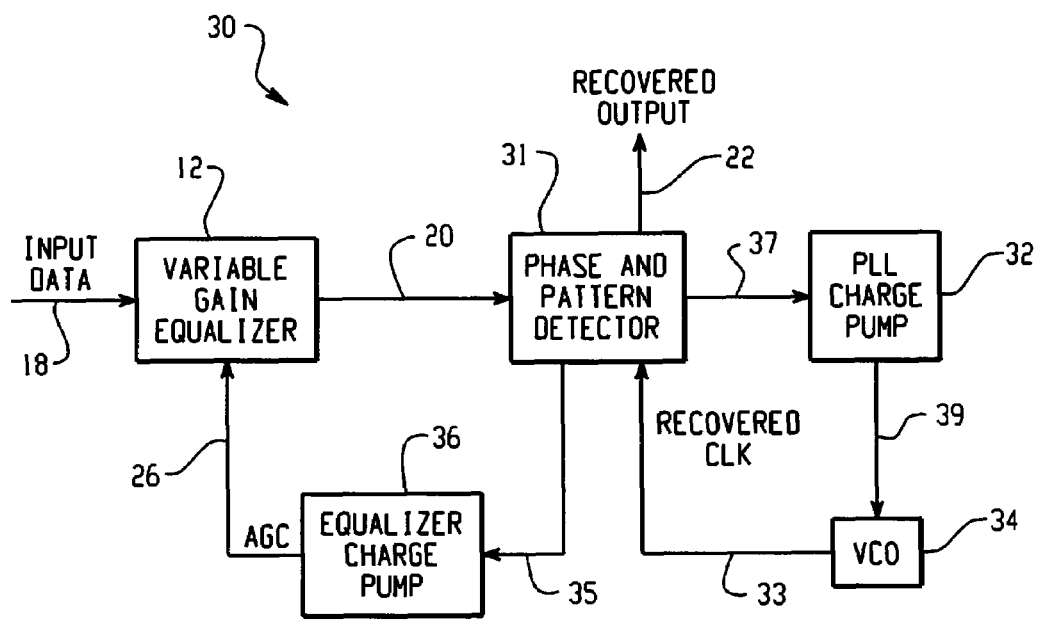
FIG. 5 is a block diagram of another example precision adaptive equalizer circuit.

FIG. 5 is a block diagram of another example precision adaptive equalizer circuit 30. The precision adaptive equalizer circuit 30 includes a variable gain equalizer 12, a phase and pattern detector circuit 31, an equalizer charge pump 36, a phase locked loop (PLL) charge pump 32 and a voltage controlled oscillator (VCO) 34. In this example 30, the phase and pattern detector circuit and the clock and data recovery circuit include a common phase detector circuit. The clock and data recovery circuit is formed by the phase and pattern detector 31, the PLL charge pump 32 and the VCO 34. In addition, the phase and pattern detector 31 is also configured in an equalizer feedback loop with the equalizer charge pump 36 and the variable gain equalizer 12.

The clock and data recovery circuit 31, 32, 34 locks a recovered clock signal 33 in phase with the equalized output signal 20 from the variable gain equalizer 12 to generate a recovered output signal 22. A phase detector circuit in the phase and pattern detector 31 compares the phases of the equalized output signal 20 and the recovered clock signal 33 to generate a control signal 37. The PLL charge pump 32 converts the control signal 37 into an analog control signal 39, which is used by the VCO 34 to control the frequency of the recovered clock signal 33. As described above with reference to FIG. 4, the clock and data recovery circuit 31, 32, 34 will lock the recovered clock signal 33 to the average of the phase positions of the low frequency data patterns (e.g., 001) and the high frequency data patterns (e.g., 101) present in the equalized output signal 20.

The phase and pattern detector 31 is also operable to detect a high frequency data pattern (e.g., 101) in the equalized output signal 20 and compare the high frequency data pattern with the recovered clock signal 33 to identify a high frequency phase error. In addition, the phase and pattern detector 31 generates an equalizer control signal 35 as a function of the high frequency phase error. An example phase and pattern detector 31 is described below in more detail with reference to FIG. 6. The equalizer charge pump 36 is operable to convert the equalizer control signal 35 into an analog automatic gain control (AGC) signal 26, which is fed back to the variable gain equalizer to control the gain applied to the input data signal 18. In operation, if the phase and pattern detector 31 detects that the high frequency data pattern is leading the recovered clock signal 33, then an equalizer control signal 35 is generated to indicate that the input data signal 18 is under-equalized. Similarly, if the phase and pattern detector 31 detects that the high frequency data pattern is lagging the recovered clock signal 33, then the equalizer control signal 35 is generated to indicate that the input data signal 18 is over-equalized.

Figure 6:
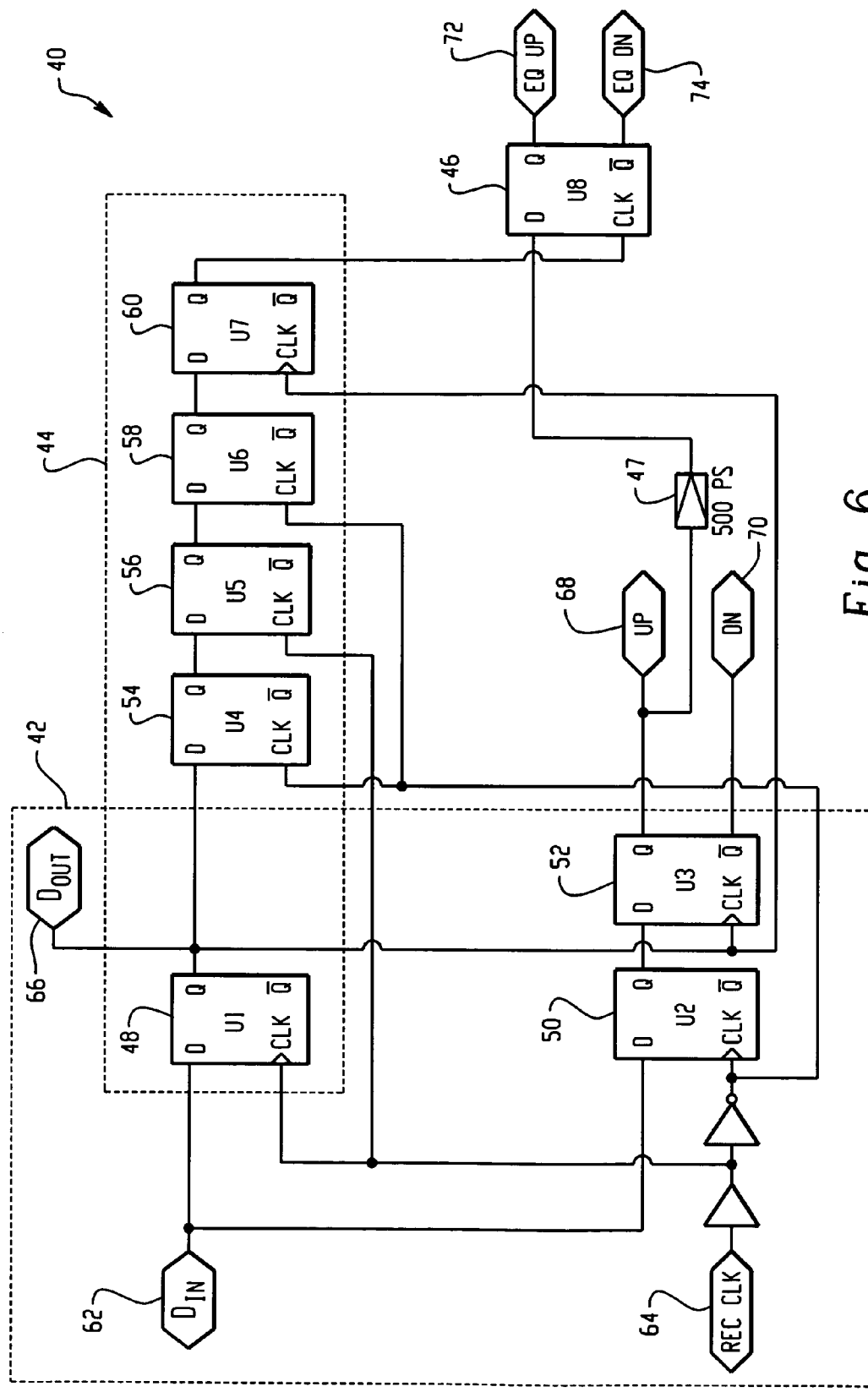
FIG. 6 is a block diagram of an example phase and pattern detector.

FIG. 6 is a block diagram of an example phase and pattern detector 40. The phase and pattern detector 40 include a phase detector circuit 42, a pattern detector circuit 44, an equalizer control signal output latch (U8) 46 and a delay element 47. The pattern detector circuit 44 includes two flip-flops (U1 and U7) and three latches (U4, U5 and U6). The phase detector circuit 42 includes three flip-flops (U1, U2 and U3). In other embodiments latches can be used to implement flip-flops and flip-flops can be configured to perform as latches.

The phase detector circuit 42 is a non-linear phase detector that is operable to compare the phases of an input signal 62 with a recovered clock signal 64 to generate two phase control signals (UP and DN) 68, 70 that indicate whether the recovered clock signal 64 is leading or lagging the input signal 62. The UP and DN phase control signal 68, 70 may, for example, be the control signal 37 of FIG. 5. In addition, when configured in a PLL, as shown in FIG. 5, the phase detector circuit 42 locks the recovered clock signal 64 into phase with the input signal 62 to generate a recovered output signal 66. The operation of the phase detector circuit 42 is described in more detail in co-owned U.S. Pat. No. 6,614,314, which is incorporated herein by reference.

The pattern detector circuit 44 is operable to detect when the high frequency data pattern "101" is present in the input signal 62. When the 101 data pattern is detected, the pattern detector circuit 44 signals the equalizer control signal output latch 46 to sample the UP phase control signal 68 to generate the equalizer control signals (EQ UP and EQ DN) 72, 74. In this manner, the phase control signal 68, 70 is output as the equalizer control signal 72, 74 when a high frequency data pattern (101) is detected. The delay element 47 is included between the phase control signal 68 and the equalizer control signal output latch 46 to avoid a possible race condition.

Figure 7:
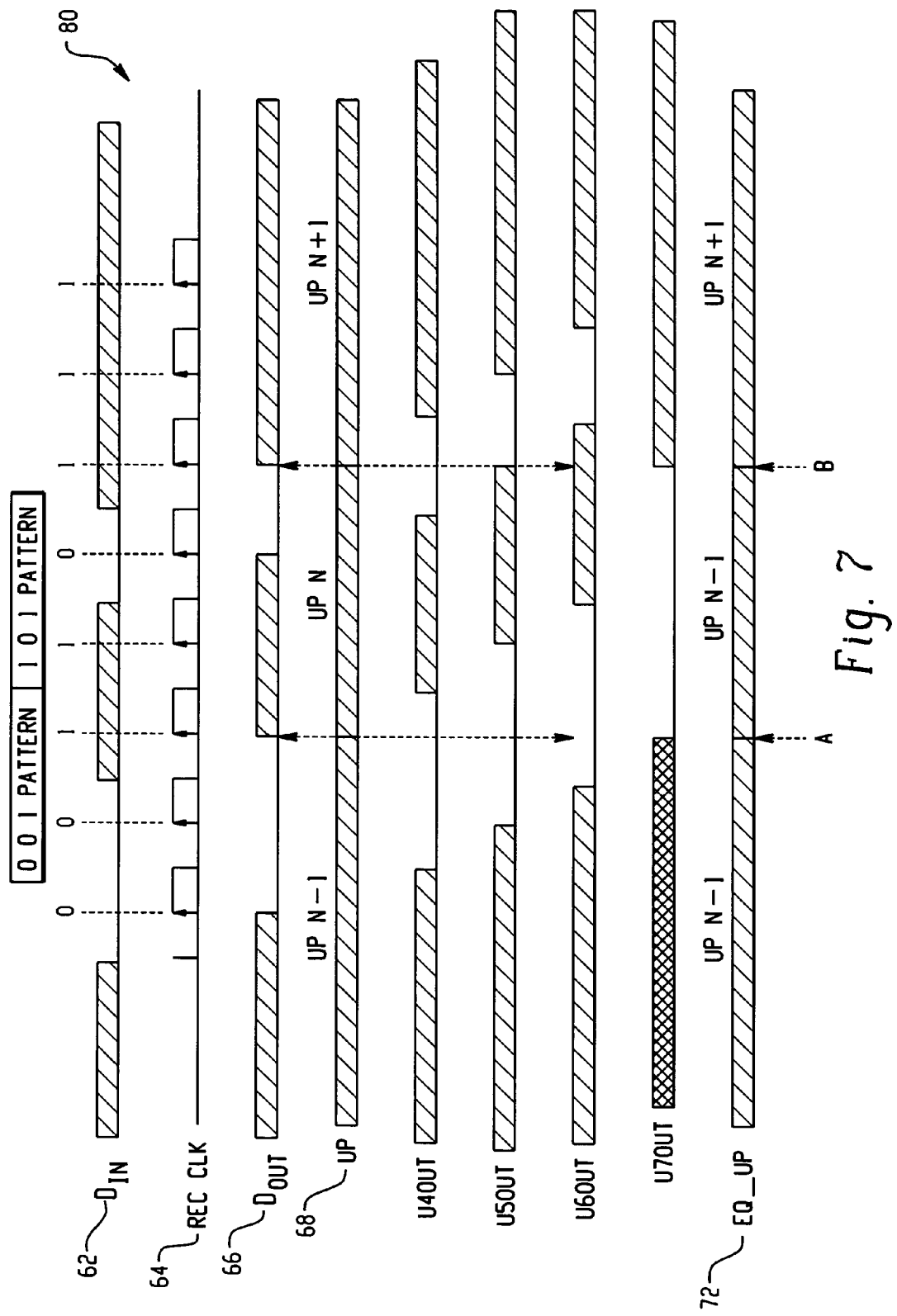
FIG. 7 is a timing diagram that further illustrates the operation of the pattern detector of FIG. 6.

FIG. 7 is a timing diagram that further illustrates the operation of the pattern detector 44 of FIG. 6. An example of the outputs (Q) from each of the pattern detector 44 flip-flops and latches, U1, U4, U5, U6 and U7, are illustrated in FIG. 7 for a data input signal of 00110111. FIG. 7 illustrates that the output (U7OUT) of U7 transitions from a logic low state to a logic high state at the occurrence of a 101 data pattern, which triggers the equalizer control signal output latch 46 to sample the UP phase control signal 68.

Cross-referencing FIGS. 6 and 7, flip-flop U1 (48) samples the input data signal 62 on the rising edge of the recovered clock signal 64 to generate the recovered output signal (Dout) 66. Latch U4 samples the recovered output signal (Dout) 66 on the falling edge of the recovered clock signal 64 to generate U4OUT. Latch U5 samples U4OUT on the rising edge of the recovered clock signal 64 to generate U5OUT. Latch U6 samples U5OUT on the falling edge of the recovered clock signal 64 to generate U6OUT. Flip-flop U7 samples U6OUT on the rising edge of the recovered output signal (Dout) 66 to generate U7OUT. The equalizer control signal output latch (U8) 46 samples the UP phase control signal 68 on the rising edge of U7OUT to generate the equalizer control signal (EQ_UP) 72.

With continuing reference to FIG. 7, prior to reference A, both the UP phase control signal 68 and the equalizer control signal (EQ_UP) 72 are in state N−1. Also, prior to reference A, U7OUT is in an undetermined state. At vertical reference A, flip-flop U7 (60) is triggered by the rising edge of the recovered output signal (Dout) 66 and transitions to a logic low state (0). Between references A and B, the UP phase control signal 68 transitions to state N (being triggered by Dout 66.) However, the equalizer control signal (EQ_UP) 72 remains at state N−1 between vertical references A and B because latch U8 has not been triggered by a rising edge on U7OUT (i.e., the pattern 101 has not been detected.) At reference B, flip-flop U7 (60) is again triggered by the rising edge of the recovered output signal 66 and samples U6OUT to transition to a logic high state (1), indicating the occurrence of a 101 pattern in the input data signal 62. The rising edge on U7OUT at reference B triggers the equalizer control signal output latch (U8) 46 to sample the UP phase control signal 68, and the equalizer control signal (EQ_UP) 72 transitions to state N+1. The equalizer control signal (EQ_UP) 72 will then remain in state N+1 until the occurrence of another 101 pattern in the input data signal 62 causes another rising edge on U7OUT.

Figure 8:
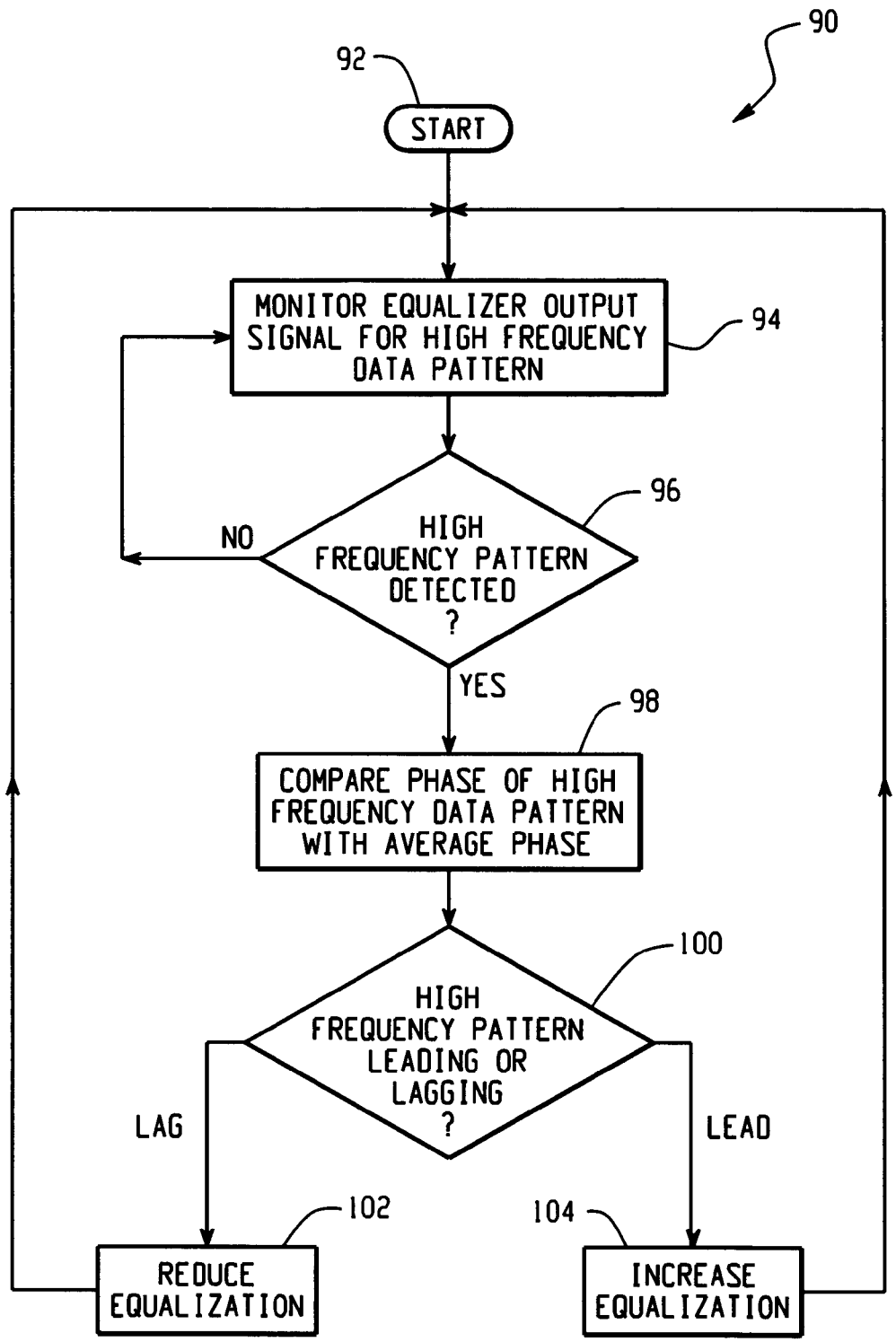
FIG. 8 is a flow diagram of an example method for controlling the output of a variable gain equalizer.

FIG. 8 is a flow diagram of an example method 90 for controlling the output of a variable gain equalizer. The method begins at step 92. At step 94, the method 90 monitors the equalizer output for a high frequency data pattern (e.g., 101.) At decision step 96, if a high frequency data pattern is detected, then the method 90 proceeds to step 98, else the method 90 continues at monitor step 94.

At step 98, the method 90 compares the phase of the detected high frequency data pattern with the phase of the average of the high and low frequency data patterns present in the equalizer output. At decision step 100, if the phase of the high frequency data pattern is leading the average phase, then the equalizer gain is increased at step 104 and the method 90 returns to step 94. Otherwise, if the phase of the high frequency data pattern is lagging the average phase, then the equalizer gain is reduced at step 102 and the method 90 returns to step 94.

This written description uses examples to disclose the invention, including the best mode, and also to enable a person skilled in the art to make and use the invention. The patentable scope of the invention may include other examples that occur to those skilled in the art. For example, in one embodiment, additional latches (or flip-flops) could be included in the pattern detector 44 of FIG. 6 to detect a high frequency data pattern greater than 3 bits in length (e.g., 10101).

The invention claimed is:

1. A precision adaptive equalizer circuit, comprising:
    a variable gain equalizer operable to apply a variable gain to an input signal to generate an equalized output signal; and
    a phase and pattern detector circuit coupled in a feedback loop with the variable gain equalizer, the phase and pattern detector circuit being operable to identify a high frequency data pattern in the equalized output signal and compare the high frequency data pattern with a clock signal to detect a high frequency phase error;
    the phase and pattern detector circuit being further operable to generate a control signal as a function of the high frequency phase error, the control signal being fed back to the variable gain equalizer to control the variable gain applied to the input signal;
    a clock and data recovery circuit operable to extract a recovered clock signal from the equalized output signal;
    wherein the phase and pattern detector circuit compares the high frequency data pattern with the recovered clock signal to detect the high frequency phase error;
    wherein the phase and pattern detector circuit and the clock and data recovery circuit include a common phase detector circuit.

2. The precision adaptive equalizer circuit of claim 1, wherein the common phase detector circuit is configured in a phase locked loop to form the clock and data recovery circuit.

3. The precision adaptive equalizer circuit of claim 1, wherein the phase and pattern detector circuit is operable to identify a high frequency data pattern 101 in the equalized output signal.

4. A precision adaptive equalizer circuit, comprising:
    a variable gain equalizer operable to apply a variable gain to an input signal to generate an equalized output signal; and
    a phase and pattern detector circuit coupled in a feedback loop with the variable gain equalizer, the phase and pattern detector circuit being operable to identify a high frequency data pattern in the equalized output signal and compare the high frequency data pattern with a clock signal to detect a high frequency phase error;
    the phase and pattern detector circuit being further operable to generate a control signal as a function of the high frequency phase error, the control signal being fed back to the variable gain equalizer to control the variable gain applied to the input signal;
    a clock and data recovery circuit operable to extract a recovered clock signal from the equalized output signal;
    wherein the phase and pattern detector circuit compares the high frequency data pattern with the recovered clock signal to detect the high frequency phase error;
    wherein the phase and pattern detector circuit is operable to identify a high frequency data pattern 101 in the equalized output signal, the phase and pattern detector comprising:
    a first flip-flop that samples the input signal on an edge of the recovered clock signal to generate a first output signal;
    a first latch that samples the first output signal on an edge of the recovered clock signal to generate a second output signal;
    a second latch that samples the second output signal on an edge of the recovered clock signal to generate a third output signal;
    a third latch that samples the third output signal on an edge of the recovered clock signal to generate a forth output signal; and
    a second flip-flop that samples the forth output signal on an edge of the first output signal to generate a pattern detector output signal;
    wherein the pattern detector output signal indicates when a high frequency data pattern is detected.

5. The precision adaptive equalizer circuit of claim 4, wherein the phase and pattern detector further comprises:
    a phase detector that compares the input signal with the recovered clock signal to generate a phase control signal.

6. The precision adaptive equalizer circuit of claim 5, wherein the phase and pattern detector further comprises:
    an equalizer control signal output latch that samples the phase control signal on an edge of the pattern detector output signal to generate the control signal.

7. The precision adaptive equalizer circuit of claim 1, further comprising:
    an equalizer charge pump coupled between the phase and pattern detector and the variable gain equalizer, the equalizer charge pump being operable to convert the control signal into an analog control signal, wherein the analog control signal is used by the variable gain equalizer to control the variable gain applied to the input signal.

* * * * *